US006927488B2

(12) United States Patent
Yoo et al.

(10) Patent No.: US 6,927,488 B2
(45) Date of Patent: Aug. 9, 2005

(54) SEMICONDUCTOR MEMORY DEVICE

(75) Inventors: Jei-Hwan Yoo, Yonging (KR);
Byung-Chul Kim, Suwon (KR);
Won-Il Bae, Youngin (KR)

(73) Assignee: Samsung Electronics Co., LTD, Suwon (KR)

(*) Notice: Subject to any disclaimer, the term of this patent is extended or adjusted under 35 U.S.C. 154(b) by 120 days.

(21) Appl. No.: 10/372,336

(22) Filed: Feb. 25, 2003

(65) Prior Publication Data

US 2005/0073033 A1 Apr. 7, 2005

(30) Foreign Application Priority Data

Feb. 27, 2002 (KR) .................. 10-2002-0010540

(51) Int. Cl.[7] ............................................. H01L 23/34
(52) U.S. Cl. ..................... 257/723; 257/778; 257/676
(58) Field of Search ............................ 257/723, 676, 257/686, 666, 777, 778, 724

(56) References Cited

U.S. PATENT DOCUMENTS

| 5,332,922 | A | * | 7/1994 | Oguchi et al. ............... 257/723 |
| 5,949,139 | A | * | 9/1999 | Imura et al. ................. 257/723 |
| 6,278,616 | B1 | * | 8/2001 | Gelsomini et al. .......... 361/803 |
| 6,340,845 | B1 | * | 1/2002 | Oda ........................... 257/777 |

* cited by examiner

Primary Examiner—Tuan H. Nguyen
(74) Attorney, Agent, or Firm—Harness, Dickey & Pierce, P.L.C.

(57) ABSTRACT

A semiconductor device package includes a plurality of semiconductor memory devices whose address input terminals are commonly connected to the external address input pins of the package, and an internal address generating device for using an address signal applied through at least one of the address input pins to select one of the memory devices to perform a read/write data operation. Only the selected memory device is enabled to perform the read/write operation on a memory cell corresponding to the received address signal. The external pin configuration of the semiconductor device package is compatible with a conventional memory board layout.

15 Claims, 10 Drawing Sheets

SEMICONDUCTOR MEMORY DEVICE

This U.S. nonprovisional patent application claims priority under 35 U.S.C. § 119 of Korean Patent Application 2002-10540 filed on Feb. 27, 2002, the entire contents of which are hereby incorporated by reference.

BACKGROUND OF THE INVENTION

1. Field of the Invention

The present invention relates to a semiconductor device package, and more particularly, to a semiconductor device package including a plurality of semiconductor memory devices.

2. Description of Related Art

Much time and effort has been spent developing higher capacity semiconductor memory devices. Accordingly, memory manufacturers have increased the capacity of semiconductor memory devices using double die package DDP technology in which two semiconductor chips are stacked upon one another in a single package. Stacked package technology has also been developed in which two semiconductor packages are stacked upon one another in a single package.

For example, a semiconductor memory device with a memory capacity of 512 Mbits of data can be manufactured using two semiconductor memory chips or packages each having a memory capacity of 256 Mbits. Another example is a semiconductor memory device with a 1 Gbit memory capacity comprising two semiconductor chips or packages each having 512 Mbits of memory capacity.

FIG. 1 illustrates an external pin configuration of a conventional semiconductor memory device with 512 Mbits of memory capacity. The external pins of the conventional semiconductor device 100 include a power voltage pin VDD, a ground voltage pin VSS, address pins A1~A12, band address pins BA0 and BA1, command pins CSB, WEB, CASB and RASB, and data input/output pins DA0~DQ3.

The semiconductor memory device 100 shown in FIG. 1 includes four memory cell array banks, each of which includes an array of $2^{13}$ rows by $2^{12}$ columns of memory cells. Each cell is accessed according to address signals including 13 row address bits (RA0~RA12) and 12 column address bits (CA0~CA12). Each memory cell is capable of processing four data bits, which are input or output via four data input/output ports. Thus, the semiconductor memory device 100 has a total memory capacity becomes $2^{13} \times 2^{12} \times 4 \times 4 = 512$ Mbits.

The operation of the semiconductor memory device 100 shown in FIG. 1 to perform a read/write data operation will be described below.

Operation of the semiconductor memory device 100 is enabled in response to receiving a set of signals, including an inverted chip selective signal applied to the inverted chip selective signal pin CSB, an inverted row address strobe command applied to the inverted row address strobe pin RASB, 13 row address bit signals (RA0~RA12) applied to the address pins A0~A12, and the bank address signals applied to the bank address pins BA0 and BA1.

Another set of signals is then applied to the semiconductor memory device 100 to perform the read/write operation. These signals include an inverted column address strobe command applied to the inverted column strobe pin CASB, 12 column address bit signals (CA0~CA9, CA11 and CA12) along with a one bit auto precharge command (CA10) applied to address pins A1~A12, and an inverted write enable signal applied to the inverted write enable signal pin WEB.

Consequently, 4 bits of data are input to the device 100 through the data input/output pins DQ0~DQ3 if a write operation is being performed. Alternatively, 4 bits of data are output from the data input/output pins DQ0~DQ3 if a read operation is being performed.

FIG. 2 illustrates an external pin configuration of a semiconductor memory device package 200 having a 1 Gbit memory capacity, which incorporates two of the 512 Mbit capacity semiconductor memory devices 100 of FIG. 1. The external pin configuration of the semiconductor memory device package includes a power voltage pin VDD, a ground voltage pin VSS, address input pins A0~A12, bank address input pins BA0~BA1, command input pins CSB1, CSB2, WEB, CASB and RASB, and data input/output pins DQ1~DQ3.

The external pin configuration of the semiconductor memory device package 200 shown in FIG. 2 includes two inverted chip selective signal pins CSB1 and CSB2, rather than the one inverted chip selective signal pin CSB of the semiconductor memory device 100 shown in FIG. 1. During a read/write data operation, the semiconductor memory device package 200 receives an inverted chip selective signal in one of the pins CSB1 and CSB2 to determine which of the two 512 Mbit semiconductor chips is to perform the data operation.

FIG. 3 illustrates connections between memory chip pads of the conventional 512 Mbit capacity semiconductor memory devices 100 and the external pins of the conventional 1 Gbit semiconductor memory device package. Specifically, FIG. 3 illustrates the 512 Mbit capacity chips implemented in the semiconductor package 200 as an upper memory chip 10-1 and a lower memory chip 10-2.

Referring to FIG. 3, each of the upper and lower memory chips 10-1 and 10-2 include a power voltage pad PVDD; a ground voltage pad PVSS; an address pad including address input terminals PA1~PA12; a bank address pad including bank address input terminals PBA0 and PBA1; a command pad including command input terminals PCSB, PWEB, PCASB, and PRASB; and a data input/output pad including data input/output terminals PDQ0~PDQ3.

Also, FIG. 3 shows the external pins to which the corresponding chip pads and terminals of the upper and lower memory chips 10-1 and 10-2 are commonly connected. The external pins include a power voltage pin VDD; a ground voltage pin VSS; address input pins A0~A12; bank address input pins BA0 and BA1; command input pins CSB1, CSB2, WEB, CASB and RASB; and data input/output pins DQ0~DQ3.

Referring to FIG. 3, all of the pads and terminals of each of the upper and the lower memory chips 10-1 and 10-2 are commonly connected to the corresponding external pins with the exception of the respective inverted chip selective signal input terminals PCSB. The inverted chip selective signal input terminal PCSB of the upper memory chip 10-1 is connected to the external inverted chip selective signal pin CSB1, and the inverted chip selective signal input terminal PCSB of the lower memory chip 10-2 is connected to the external inverted chip selective signal pin CSB2.

In other words, the conventional semiconductor memory device package 200 shown in FIG. 2 and FIG. 3 is configured such that the upper memory chip 10-1 is enabled to perform a read/write data operation when an inverted chip selective signal is applied to the inverted chip selective signal pin CSB1, and enable the lower memory chip 10-2 to perform a data operation in response to an inverted chip selective signal applied to the inverted chip selective signal pin CSB2.

A read/write data operation is performed using the conventional semiconductor memory device package 200 shown in FIG. 2 and FIG. 3 will operate as follows.

When an inverted chip selective signal is applied to the inverted chip selective signal pad CSB1, and the other address, bank address and command input signals are applied to the read/write operation of the 512 Mbit device 100 of FIG. 1, the upper memory chip 10-1 performs the write/read operations to input/output data.

When an inverted chip selective signal is applied to the inverted chip selective signal pad CSB2, along with the other address, bank address and command input signals described above in connection with the read/write operation of the 512 Mbit device 100 of FIG. 1, the lower memory chip 10-2 performs the write/read operations to input/output data.

Thus, by incorporating two 512 Mbit capacity semiconductor memory chips or packages together into a single semiconductor package 200, a semiconductor memory device having a memory capacity of 1 Gbit can be manufactured.

However, the semiconductor memory device shown in FIGS. 2 and 3 is not capable of using a conventional semiconductor memory board layout, since the internal upper and lower memory chips 10-1 and 10-2 are separately enabled by chip selective signals applied to separate external pins (CSB1 and CSB2) of the semiconductor memory device package 200.

In other words, the conventional board is configured to control the semiconductor memory device using one chip selective signal rather than two. Accordingly, a board having a different type of configuration than the conventional board must be fabricated to utilize the semiconductor memory device package 200 shown in FIGS. 2 and 3.

FIG. 4 shows an external pin configuration of an alternative 1 Gbit capacity semiconductor memory device package in the conventional art, which incorporates two conventional 512 Mbit capacity semiconductor memory devices. The pin configuration shown in FIG. 4 differs with the pin configuration of the conventional semiconductor memory device package shown in FIG. 2 by including an additional address pin A13.

The 512 Mbit capacity memory chips used in the semiconductor memory device package 300 of FIG. 4 are different from the memory chip of FIG. 1 and include four memory cell array banks, where each memory cell array being arranged in $2^{14}$ rows by $2^{12}$ columns of cells. Thus, the memory cells are accessed using 14 row address bits (RA0~RA13), 12 column address bits (CA0~CA11). Each cell is capable of holding two bits of data, which are input or output via two data input/output ports. Accordingly, the total memory capacity becomes $2^{14} \times 2^{12} \times 4 \times 2 = 512$ Mbits. Since the semiconductor memory device package 300 incorporates two of these 512 Mbit capacity memory chips, the memory capacity of the semiconductor package 300 is 1 Gbit.

FIG. 5 illustrates connections between memory chip pads of the conventional 512 Mbit capacity memory chips and the plurality of external pins of the semiconductor package 300 of FIG. 4. FIG. 5 shows the 512 Mbit capacity chips implemented in the semiconductor package 300 as an upper memory chip 20-1 and a lower memory chip 20-2.

Referring to FIG. 5, each of the upper and lower memory chips 20-1 and 20-2 include a power voltage pad PVDD; a ground voltage pad PVSS; an address pad including address input terminals PA1~PA13; a bank address pad including bank address input terminals PBA0 and PBA1; and a command pad including command input terminals PCSB, PWEB, PCASB and PRASB; and a data input/output pad including data input/output terminals PDQ0 and PDQ1.

Also, FIG. 5 shows the external pins to which the corresponding chip pads and terminals of the upper and lower memory chips 20-1 and 20-2 are connected. These external pins include a power voltage pin VDD; a ground voltage pin VSS; address input pins A0~A13; bank address pins BA0 and BA1; command input pins CSB1, CSB2, WEB, CASB and RASB; and data input/output pins DQ0~DQ3.

Referring to FIG. 5, all of the pads and terminals of each of the upper and the lower memory chips 20-1 and 20-2 are commonly connected to the corresponding external pins with the exception of the data input/output terminals PDQ0 and PDQ1. The data input/output pads PDQ0 and PDQ1 of the upper memory chip 20-1 is connected to the external data input/output pins DQ0 and DQ1, and the data input/output pads PDQ0 and PDQ1 of the lower memory chip 20-2 are connected to the external data input/output pins DQ2 and DQ3.

In other words, the conventional semiconductor memory device package 300 shown in FIG. 4 and FIG. 5 are configured to enable both the upper and the lower memory chip 20-1 and 20-2 to respond to an inverted chip selective signal applied to the inverted chip selective signal pin CSB and input or output data via their respective data input/output terminals PDQ0 and PDQ1. Thus, both memory chips 20-1 and 20-2 perform a read/write operation using their respective memory cell, which corresponds to the address bit signals applied to external pins A0~A13. That is, the data is input or output through the external data input/output pins DQ0~DQ3, the data bits at pins DQ0 and DQ1 being processed by the upper memory chip 20-1 and the data bits at DQ2 and D03 being processed by the lower memory chip 20-2.

However, while the conventional semiconductor memory device package 300 shown in FIG. 4 and FIG. 5 utilizes the conventional board layout, it dissipates a high amount of current because both the upper and lower memory chips 20-1 and 20-2 are configured to respond to the inverted chip selective signal CSB, thereby causing both chips 20-1 and 20-2 to simultaneously operate in order to perform a read/write data operation on either.

SUMMARY OF THE INVENTION

Exemplary embodiments of the present invention provide a semiconductor memory device package including two or more semiconductor memory devices whose address input terminals are commonly connected to the external address pins of the package and an internal address generating device for selecting one of the semiconductor memory devices to perform a data read/write operation based on the address signal received at the external address pins.

In an exemplary embodiment, the external pins of the semiconductor memory device package includes address input pins receives an address signal including one or more cell address bit signals and one or more device selection bit signals. Upon receiving an activating command signal and the address signal, the internal address device uses the device selection bit signal(s) to select a semiconductor memory device to perform a read/write data operation. The selected semiconductor memory device performs the data operation using a memory cell in the device corresponding to the cell address bit signals.

In an exemplary embodiment, each semiconductor memory device may include an internal address generating device for each semiconductor memory device and a control terminal set to a certain voltage state. The voltage state of the control terminal may be set based on the presence or absence of an electrical connection between the control terminal and a voltage source terminal. The external pins of the semiconductor package may also include a command input pin, which is commonly connected to a corresponding command input terminal of each semiconductor memory device, for receiving an activation command signal. Each internal address generating device may be configured to enable the corresponding device to perform a read/write data operation in response to the received activation signal, based on the device selection bit signal(s) and the voltage state of the device's control terminal.

In an exemplary embodiment, the semiconductor package includes two semiconductor memory devices. The received address signal may include a device selection signal comprising a row decoder bit signal, which is received along with cell address signals comprising a set of row address bit signals. The value of the row decoder bit signal determines which of the two semiconductor device is selected to perform the read/write data operation.

In another exemplary embodiment, the semiconductor package may include four semiconductor memory devices. The received address signals may include a device selection signal comprising a row decoder bit signal, which is received along with cell address signals comprising a set of row address bit signals. The received address signals may further include another device selection signal comprising a column decoder signal, which is received along with a set of column address signals comprising a set of column address bit signals. The value of both the row decoder bit signal and the column bit signal determine which of the four semiconductor devices is selected to perform the read/write data operation.

By using the received address signal to select one of the semiconductor memory devices to perform the data operation, the semiconductor package according to exemplary embodiments of the present invention can be implemented on a conventional layout board without dissipating the high amount of operational current associated with simultaneously activating each semiconductor memory device to perform a data operation.

BRIEF DESCRIPTION OF THE DRAWINGS

The above and other features of the present invention will become readily apparent from the description of the exemplary embodiments that follows, with reference to the accompanying drawings, in which like reference numerals designate like elements, and in which.

DETAILED DESCRIPTION OF EXEMPLARY EMBODIMENTS

The present invention will now be described more fully with reference to the accompanying drawings, in which exemplary embodiments of the invention are shown. However, the present invention may be embodied in many different forms and should not be construed as being limited to the exemplary embodiments set forth herein. Rather, these exemplary embodiments are provided for the purpose of illustration; the present invention covers various changes in form and detail as will be readily contemplated by those ordinarily skilled in the art.

For instance, for the purposes of illustration, exemplary embodiments of the present invention are described below with respect to semiconductor memory device packages utilizing a plurality of semiconductor memory devices each having a 512 Mbit memory capacity. One of ordinary skill in the art will realize that exemplary embodiments of the present invention allow for semiconductor packages of varying memory capacities to be implemented.

For example, an exemplary embodiment of the present invention may provide a 512 Mbit capacity semiconductor memory device package using two 256 Mbit capacity semiconductor memory devices.

Figure 1:
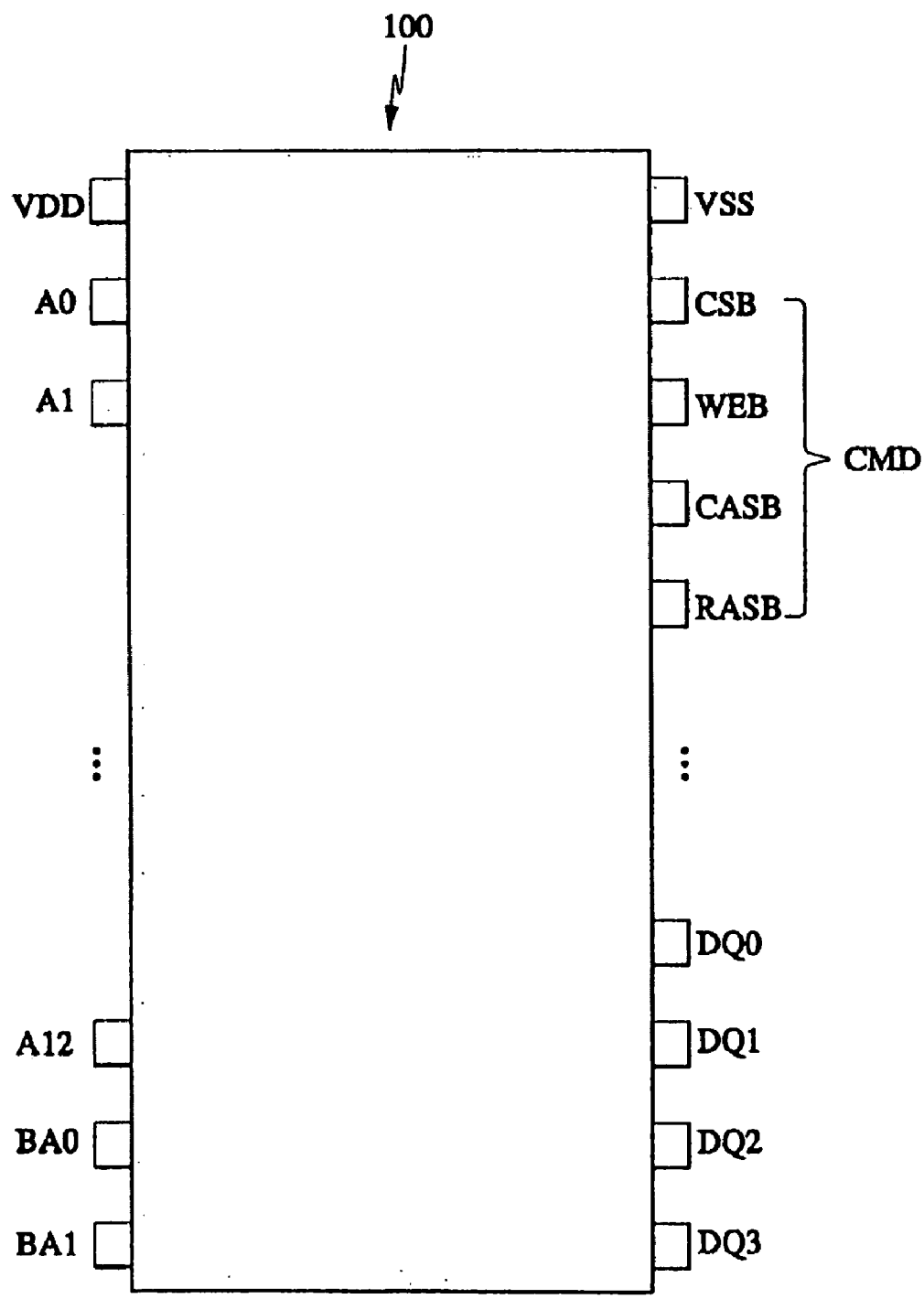
FIG. 1 illustrates an external pin configuration of a conventional semiconductor memory device with 512 Mbits of memory capacity.
Figure 2:
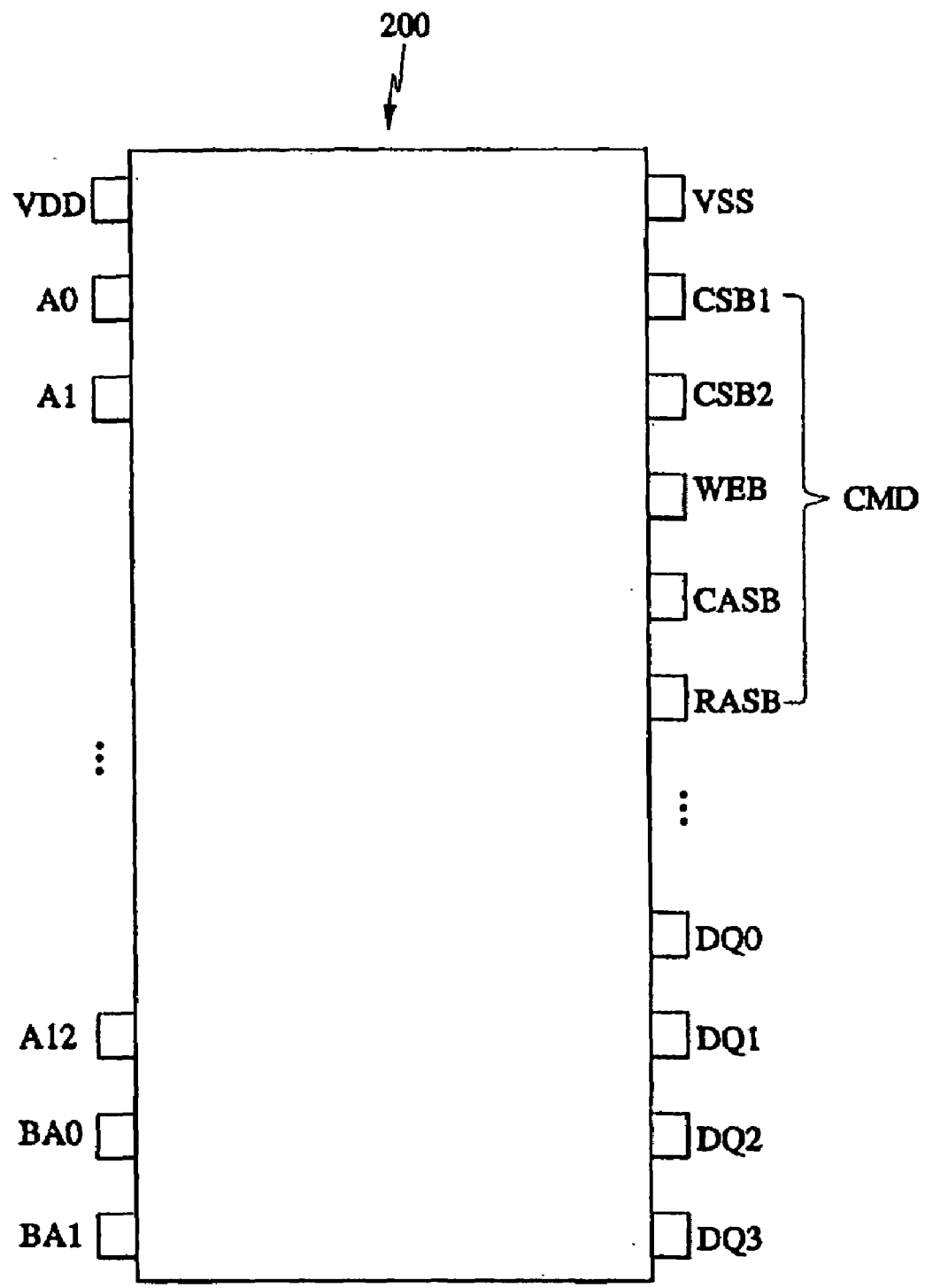
FIG. 2 illustrates an external pin configuration of a semiconductor memory device with a 1 Gbit memory capacity, which incorporates two of the conventional 512 Mbit capacity semiconductor memory devices of FIG. 1.
Figure 3:
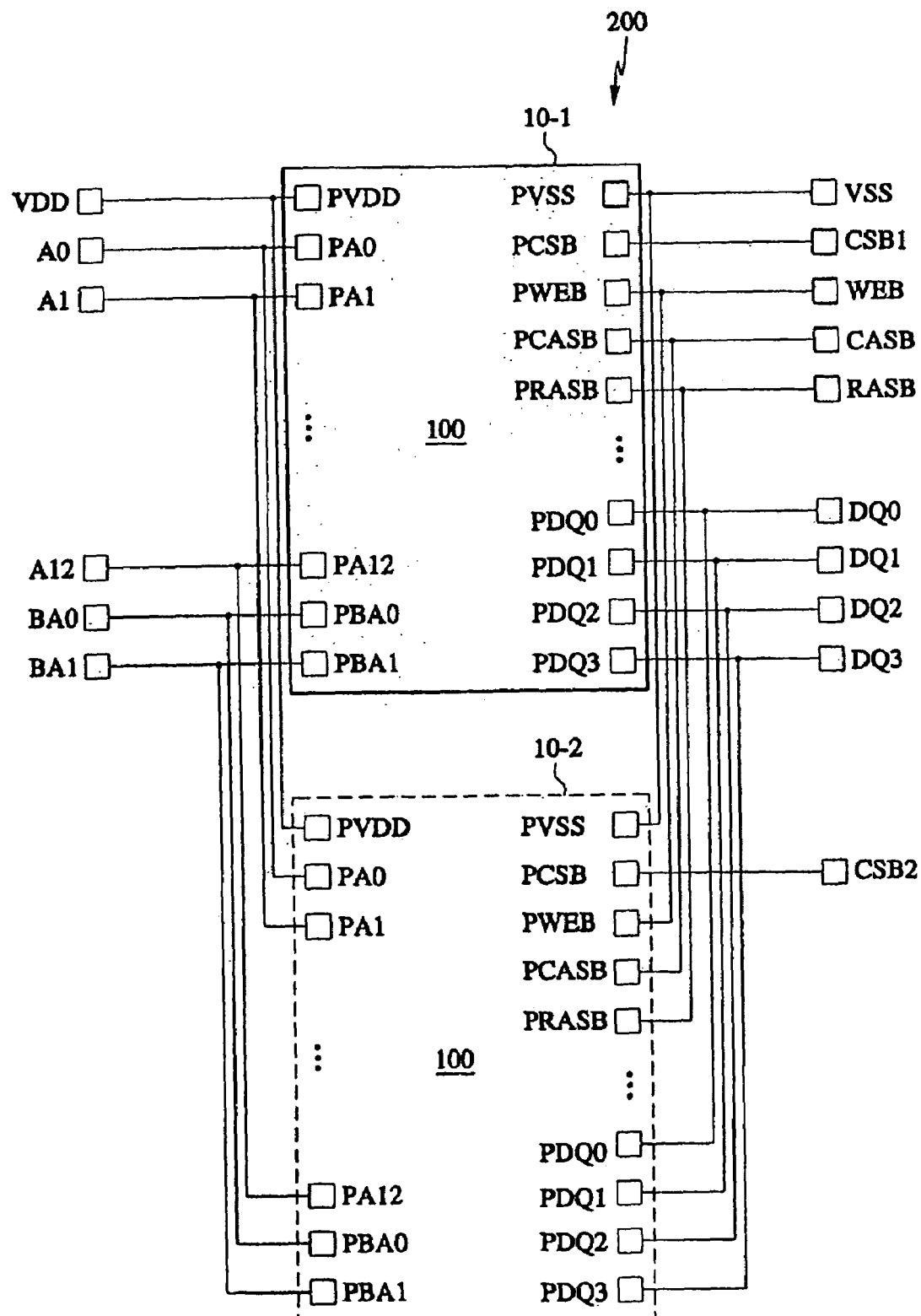
FIG. 3 illustrates connections between memory chip pads of the conventional 512 Mbit memory devices and the external pins of the conventional 1 Gbit semiconductor memory device package of FIGS. 1 and 2.
Figure 4:
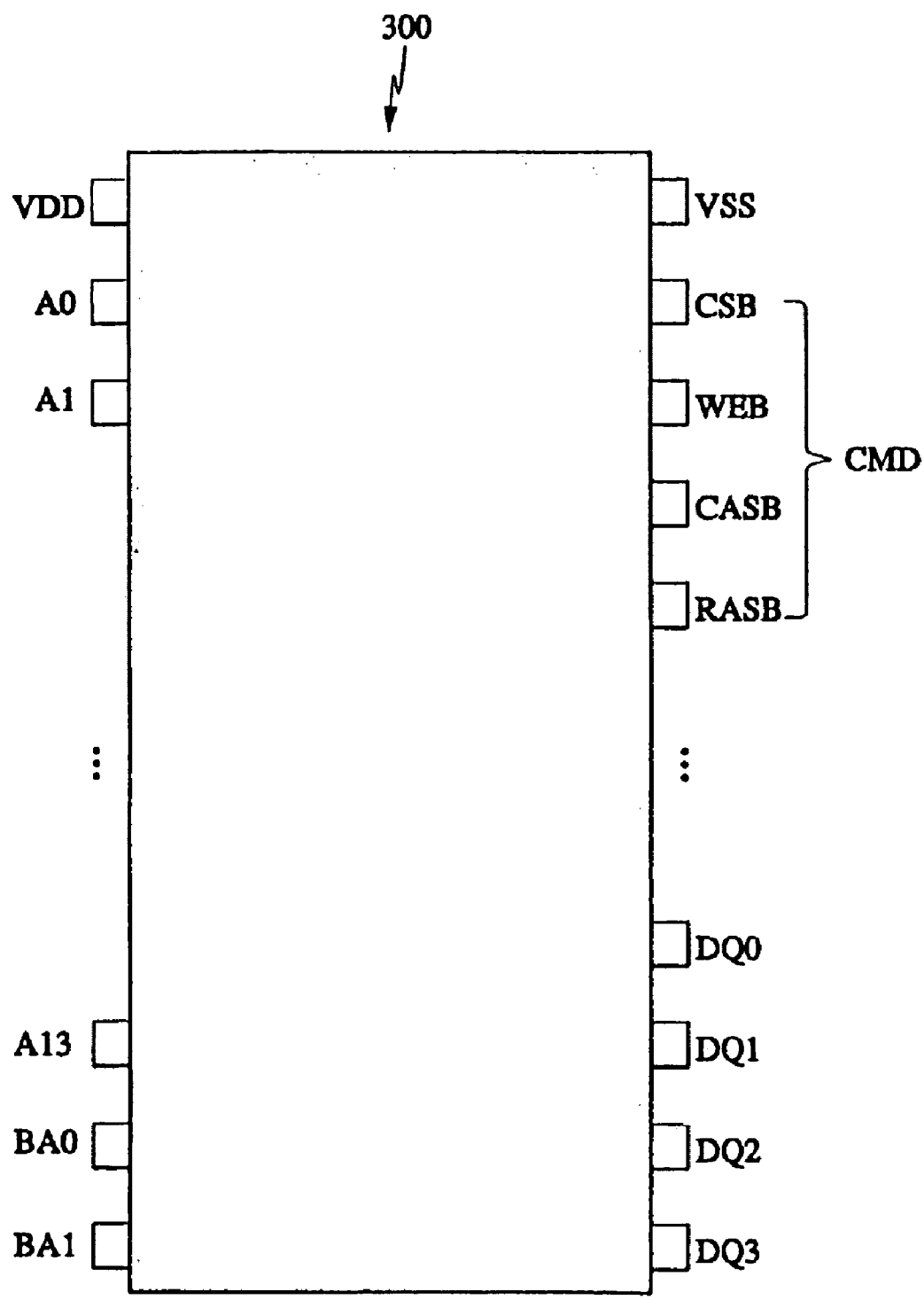
FIG. 4 illustrates an external pin configuration of an alternative 1 Gbit capacity semiconductor memory device package in the conventional art, which incorporates two conventional 512 Mbit capacity semiconductor memory devices.
Figure 5:
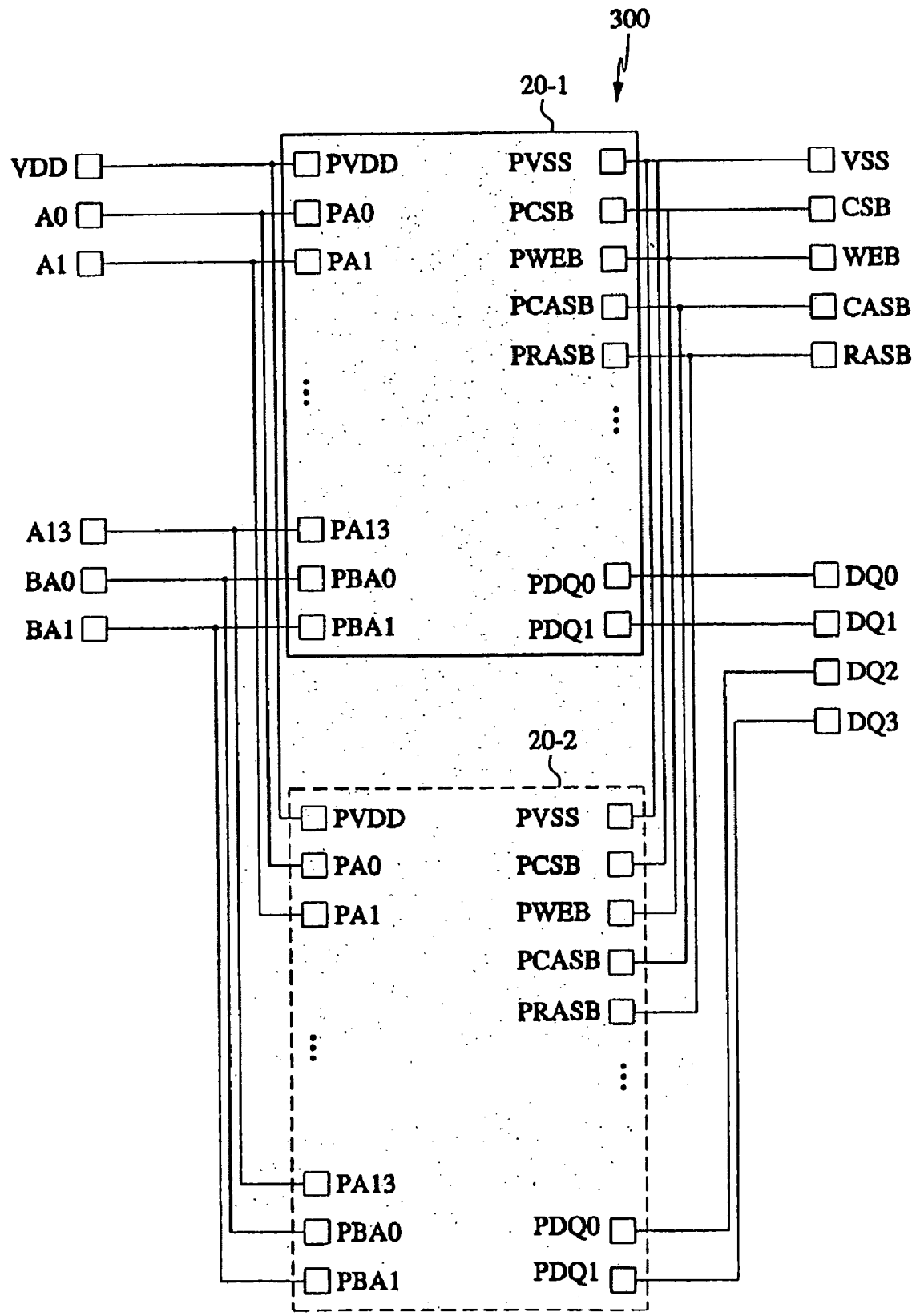
FIG. 5 illustrates connections between memory chip pads of the conventional 512 Mbit and the external pins of the conventional 1 Gbit semiconductor memory device package of FIG. 4.

According to an exemplary embodiment of the present invention, the external pins of the semiconductor package are configured to be compatible with a conventional semiconductor memory board layout. For example, in an exemplary embodiment of the present invention, a semiconductor memory device package has a 1 Gbit memory capacity, may include the external pin configuration of the semiconductor package shown in FIG. 4.

Figure 6:
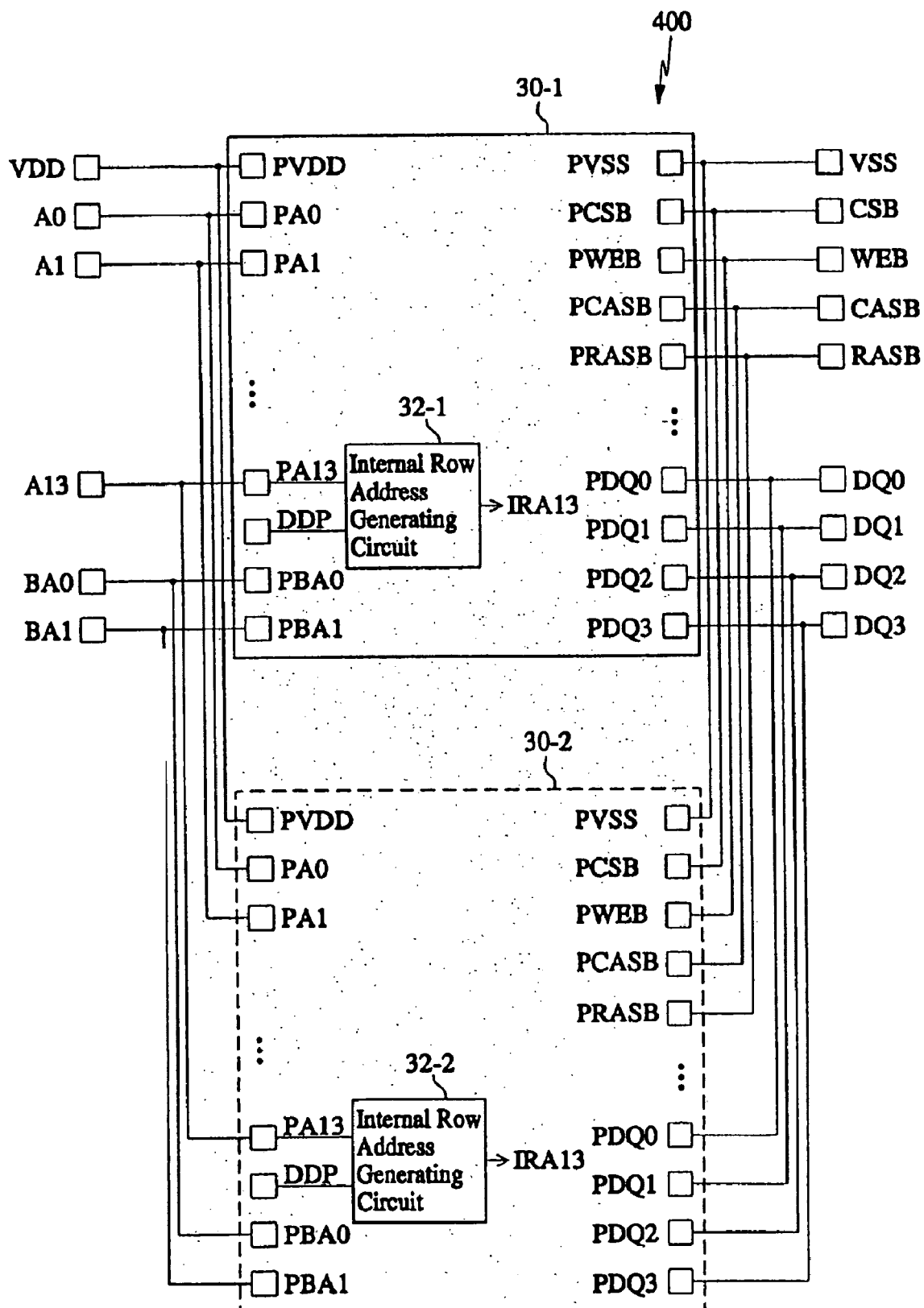
FIG. 6 illustrates connections between memory chip pads of two 512 Mbit semiconductor memory devices and the external pins implemented in a semiconductor memory device package according to an exemplary embodiment of the present invention.

FIG. 6 illustrates connections between memory chip pads of two 512 Mbit capacity memory devices (memory chips) and the external pins of a semiconductor memory device package 400 according to an exemplary embodiment of the present invention. The memory chips are implemented as an upper memory chip 30-1 and a lower memory chip 30-2, each having an internal address generating device, i.e., internal row address generating devices 32-1 and 32-2, respectively.

Referring to FIG. 6, each of the upper and lower memory chips 30-1 and 30-2 includes a power voltage pad PVDD; a ground voltage pad PVSS; an address pad including address input terminals PA0~PA13; a bank address pad including bank address input terminals PBA0 and PBA1; and a command pad including command input terminals PCSB, PWEB, PCASB and PRASB; a data input/output pad including data input/output terminals PDQ0~PDQ, and a control pad DDP.

Also, FIG. 6 shows the external terminals to which the chip pads and terminals of the upper and lower memory chips 30-1 and 30-2 are connected. The external pins include a power voltage pin VDD; a ground voltage pin VSS; address input pins A0~A13; bank address input pins BA0 and BA1; command input pins CSB, WEB, CASB and RASB; and data input/output pins DQ0~DQ3.

The 512 Mbit capacity memory chips 30-1 and 30-2 may respectively include four memory cell array banks, each array including $2^{13}$ rows by $2^{12}$ columns of memory cells. Each memory cell in an array bank may correspond to a cell address represented by 13 row address bits (RA0~RA13) and 12 column address bits (CA0~CA9, CA11 and CA12). Each cell holds four data bits, which are input or output via data input/output ports. Accordingly, the total memory capacity of each of the memory chips 30-1 and 30-2 is $2^{13} \times 2^{12} \times 4 \times 4 = 512$ Mbits.

While the memory chips 30-1 and 30-2 require only thirteen address input terminals PA0~PA12 to receive an address corresponding to a memory cell, the address pad for each of the memory chips 30-1 and 30-2 includes an additional address input terminal PA13. The signals applied to the address input terminal PA13 and control pad DDP of each of the memory chips 30-1 and 30-2 are used to determine whether the respective memory chip is selected (i.e., enabled) to perform the read/write operation.

The control pad DDP of the upper memory chip 30-1 is set at a different voltage state than the control pad DDP of the lower memory chip 30-2. Thus, the internal row address signals IRA13 generated for the upper memory chip will be opposite bit values (i.e., complementary). For example, when the internal row address signal IRA13 generated for the upper memory chip 30-1 is at a HIGH "H" level, the internal row address signal IRA13 generated for the lower memory chip 30-2 will be at a LOW "L" level, and vice versa.

In an exemplary embodiment, the voltage state for the control terminal DDP of each of the upper and lower memory chips 30-1 and 30-2 is determined based on whether or not it is electrically connected to a power voltage VDD. For example, each of the memory chips 30-1 and 30-2 may be manufactured to include a fuse link (not shown) connecting the control terminal DDP to the corresponding power voltage pad PVDD. Thereafter, the fuse link of one of the memory chips 30-1 and 30-2 may be blown, for example, using the same type of technology used to blow fuse links while programming programmable logic devices (PLDs). Accordingly, the control terminal DDP of the memory chip whose fuse link has been blown may be set at a LOW "L" voltage level, while the control terminal of the memory chip whose fuse link remains in tact will be set at a HIGH "H" voltage level by virtue of its connection to the applied power voltage.

According to other exemplary embodiments, the memory chips 30-1 and 30-2 may be manufactured to include other types of electrically conductive links (not shown), e.g., metallic links, between the control terminals DDP and the corresponding power voltage pads PVDD. When configuring the semiconductor package 400, the link of one of the memory chips 30-1 and 30-2 may be cut or disconnected using a process known to those of ordinary skill in the art in order to set the corresponding control terminal DDP to a LOW "L" level.

In another exemplary embodiment, a control terminal DDP need not be connected to a corresponding power voltage pad PVDD to be set at a HIGH "H" voltage level. For example, a control terminal DDP at a HIGH "H" voltage state may be connected directly to a power voltage pin VDD of the semiconductor package 400.

Exemplary embodiments of the present invention are not limited to using fuse links or other types conductive links to set the voltage level of the control terminal DDP, but rather cover all processes that are known or will be known in the art for establishing (and/or disconnecting) electrical connections between the control terminal DDP and an external voltage source (e.g., power voltage pad PVDD or power voltage pin VDD) of the semiconductor package 400. For example, certain types of switches may be also be used to make such connections.

According to an exemplary embodiment, a row address signal decoder (not shown) for each of the memory chips 30-1 and 30-2 is enabled when the internal row address signal IRA13 generated by the corresponding internal row address generating circuit 32-1 or 32-2 has a specific bit value (i.e., is at a specific voltage level). Thus, when a generated internal row address signal IRA13 has a bit value enabling the corresponding memory chip, the internal row address signal IRA13 can be referred to as a row enabling signal.

Referring to FIG. 6, all of the pads for each of the upper and lower memory chips 30-1 and 30-2 are commonly connected to their corresponding external pins.

Next, the operation of the semiconductor memory device package 400 shown in FIG. 6 to perform a read/write data operation according to an exemplary embodiment will be described.

A set of signals is applied to the external pins, including an inverted chip selective signal, which is applied to the inverted chip selective signal pin CSB. Also, an inverted row address strobe command is applied to the inverted row address strobe pin RASB; 13 row address bit signals (RA0~RA12) and a row decoder bit signal are applied to the address pins A0~A12 and A13, respectively; and two bank address bit signals are applied to the bank address pins BA0 and BA1.

At this time, the row decoder bit signal, which is applied to pin A13, is input to the internal row address generating devices 32-1 and 32-2, respectively. The internal row address generating devices 32-1 and 32-2 each generate an internal row address IRA13 based on the received row decoder bit signal and the voltage state of the corresponding control pad DDP. If the generated internal row address IRA13 is a specific bit value (i.e., is a row enabling signal), the row address signal decoder (not shown) of the corresponding memory chip is enabled to decode the row address signals (RA0~RA12). Thus, the row address decoder (not shown) of the selected memory chip 30-1 or 30-2 outputs a signal for accessing the row of memory cells (not shown) corresponding to the row address bit signals (RA0~RA12).

Another set of signals are applied to the external pins of the semiconductor package 400. An inverted address strobe command signal is applied to the inverted column address strobe pin CASB, and the 13 column address bit signals (CA0~CA9 and CA11~CA13) and the 1 bit auto precharge command CA10 are applied to the address pins A1~A13. At this time, an inverted write enable signal is applied to the inverted write enable signal pin WEB. The read/write operation is performed in response to the inverted write enable signal.

Thus, four bits of data is input to or output via the data input/output pins DQ0~DQ3 to the memory cell of the selected memory chip 30-1 or 30-2, which corresponds to the received row bit signals (RA0~RA12) and column bit signals (CA0~CA9, CA11~CA13).

According to the exemplary embodiment of the present invention described above, the plurality of the pads of the upper and lower memory chips 30-1 and 30-2 are commonly connected to the corresponding external pins semiconductor package 400. Either the upper or lower memory chips can be enabled to perform a read/write command, even though only one inverted chip selective signal can be received by the semiconductor package 400, based on the row decoder bit signal RA13 applied to address pin A13.

Accordingly, the semiconductor memory device package 400 of the present invention as shown in FIG. 6 may be implemented using a conventional semiconductor memory board layout. Further, the semiconductor package 400 can perform a read/write data operation without simultaneously operating both the upper and lower memory chips 30-1 and 30-2, thereby reducing the operation current required to perform the operation.

Figure 7:
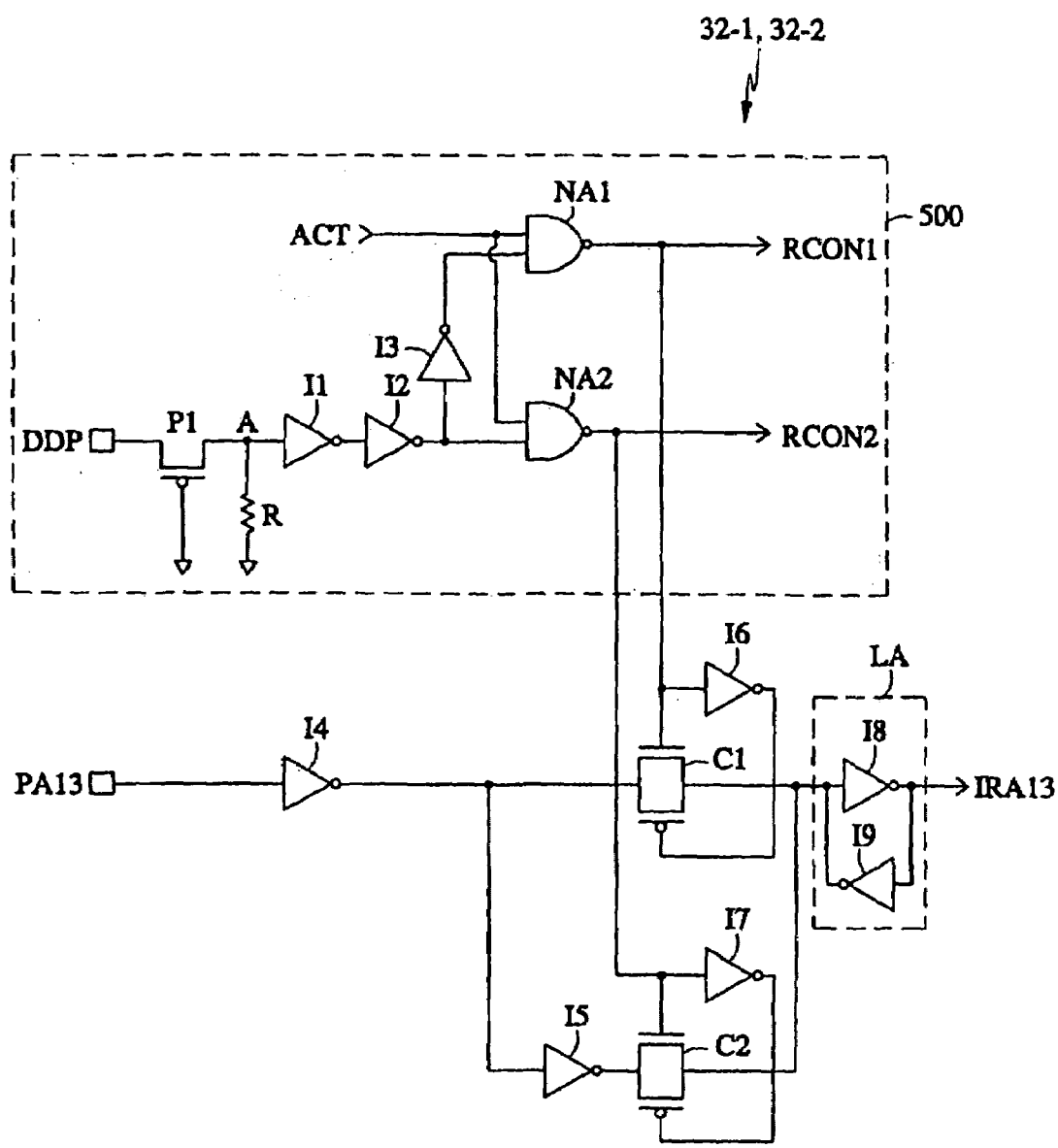
FIG. 7 illustrates a schematic view of an internal address generating device used in the semiconductor memory devices implemented in the semiconductor memory device package of FIG. 6 according to an exemplary embodiment of the present invention.

FIG. 7 illustrates a schematic view of an internal row address generating device 32-1, 32-2 used in the upper and lower memory chips 30-1 and 30-2 of FIG. 6 according to an exemplary embodiment of the present invention. The internal row address generating circuit includes a row control signal generating device 500 comprising PMOS transistor P1, a resistor R, a plurality of the inverters I1~I3, and NAND logic gates NA1 and NA2. The outputs of the row control signal generating device 500 include the output of NAND gate NA1, which is used for outputting a first row control signal RCON1, and the output of NAND gate NA2, which is used to output a second row control signal RCON2.

One of the input terminals of the NAND gate NA1 is connected to a command pin for receiving an activation command signal ACT applied to the semiconductor package 400. For example, the activation command signal ACT may be a command signal received along with the column address bit signals, for example, the inverted chip selective signal. Thus, the corresponding terminal of NAND gate NA1 may be connected to the inverted chip selective signal pin CSB of the semiconductor package 400.

The internal row address generating device 32-1, 32-2 also includes inverters I4~I7, CMOS transfer gates C1 and C2, and a latch LA comprised of inverters I8 and I9. The output of latch LA is used to output the internal row address signal IRA13. The signal path consisting of inverter I4, transfer gate C1 and latch LA operate to transfer the row decoding signal applied at chip pad PA13 when the transfer gate C1 is turned on. The signal path consisting of inverter I4, inverter I5, transfer gate C2, and latch LA operate to invert the row decoding signal applied at chip pad PA13 when transfer gate C2 is turned on.

The operation of the circuit shown in FIG. 7 will now be described. For the purpose of illustration only, it will be assumed that the control terminal DDP of the internal row address generating device 32-1, 32-2 described below is initially electrically connected to a power voltage pad PVDD of the corresponding memory chip 30-1, 30-2 using either a fuse link or metal link (not shown). Thus, if the voltage level of the control terminal DDP is set at a LOW "L" level, it is done so by cutting or otherwise disengaging this connection.

If the control terminal's electrical connection (not shown) is disconnected, a node A is fixed to a LOW voltage level (hereafter "level L"). If the connection is in tact, the node A is fixed to a HIGH level (hereafter "level H").

If the node A is at level L, the inverter I1 will output a level H signal and the inverter I2 will output a level L signal. The inverter I3 inverts the level L signal from inverter I2 to output a level H signal. When a level H activation command signal ACT is applied to the semiconductor package 400, the NAND gate NA1 performs a NAND operation on the activation command signal ACT of 'H' level and the level H output signal from the inverter I3 to output a first row control signal RCON1 of level L. The NAND gate NA2 performs a NAND operation on the level H active command signal ACT and the level L signal output from the inverter I2 to output a second row control signal RCON2 of level H.

Thus, in response to the row control signal generating device generating the second row control signal RCON2 as a level H signal, the CMOS transfer gate C1 is turned-off, and the CMOS transfer gate C2 is turned-on. This causes the latch LA to output an internal address signal IRA13 as an inverted version of the row decoder bit signal in the following manner.

Thus, when a row decoder bit signal of level H is applied to the address input terminal PA13, the inverter I4 outputs a signal of level L. The inverter I5 inverts the signal of level L to output a level H signal. The level H output signal is transferred through the CMOS transfer gate C2. The latch LA latches and inverts the level H signal from the transfer gate C2 to output an internal row address IRA13 of level L. the latch LA outputs the internal row address IRA13 of 'H' level, when the row address RA13 of 'L' level is applied through the address input terminal PA13.

In a similar fashion, when the node A is level L (i.e., control terminal DDP is set at level L) and a row decoder bit signal of level L is applied to the address input terminal PA13, the latch LA will output an inverted version of the row decoding signal to generate a level H internal row address signal IRA13. Thus, a row enabling signal will be output.

If the control terminal DDP, and consequently node A, is set at level H, the row control signal generating device 500 will operate as follows. the inverter I1 will output a lever L signal and inverter I2 will output a signal of level H. The inverter I3 inverts the level H signal from inverter I2 to output a signal of level L. The NAND gate NA1 performs a NAND operation on the received level H active command signal ACT and the level L signal output from the inverter I3. Thus, NAND gate NA1 outputs the first row control signal RCON1 at level H. The NAND gate NA2 performs a NAND operation on the level H active command signal ACT and the level H signal output from the inverter I2 to output a second row control signal RCON2 of level L.

Thus, the row control signal generating device 500 outputs the first row control signal RCON1 as a level H signal, causing CMOS transfer gate C1 to be turned on, and CMOS transfer gate C2 to be turned off. As such, the row decoder bit signal applied at address input terminal PA13 will be transferred as the internal row address signal IRA13 according to the following operation.

When the row decoder bit signal of level H is applied to the address input terminal PA13, the inverter I4 outputs a signal of level L. The level L signal from the inverter I4 is transferred through the CMOS transfer gate C1 to the latch LA, which inverts the signal to output the internal row address signal IRA13 of 'H' level (thus generating a row enabling signal). In a similar manner, the latch LA outputs the internal row address signal IRA13 as a level L signal when a level H row decoder bit signal is applied to the address input terminal PA13.

As described above, since the control terminals DDP of the upper and lower memory chips 30-1 and 30-2 are set at opposite voltage levels, the corresponding internal row address generating circuits 32-1 and 32-2 will generate internal row address signals IRA13 of opposite voltage levels. Thus, the row address signal decoder (not shown) of only one of the upper and lower memory chips 30-1 and 30-2 can decode the received row address bit signals in order to perform the read/write data operation.

It should be noted that while FIG. 7 illustrates an exemplary embodiment of the configuration of the internal row address generating device 32-1, 32-2, the present invention is not thus limited. Alternatively, the internal row address generating device 32-1 and 32-2 may comprise any known equivalents as will be readily apparent to those of ordinary skill in the art.

Figure 8:
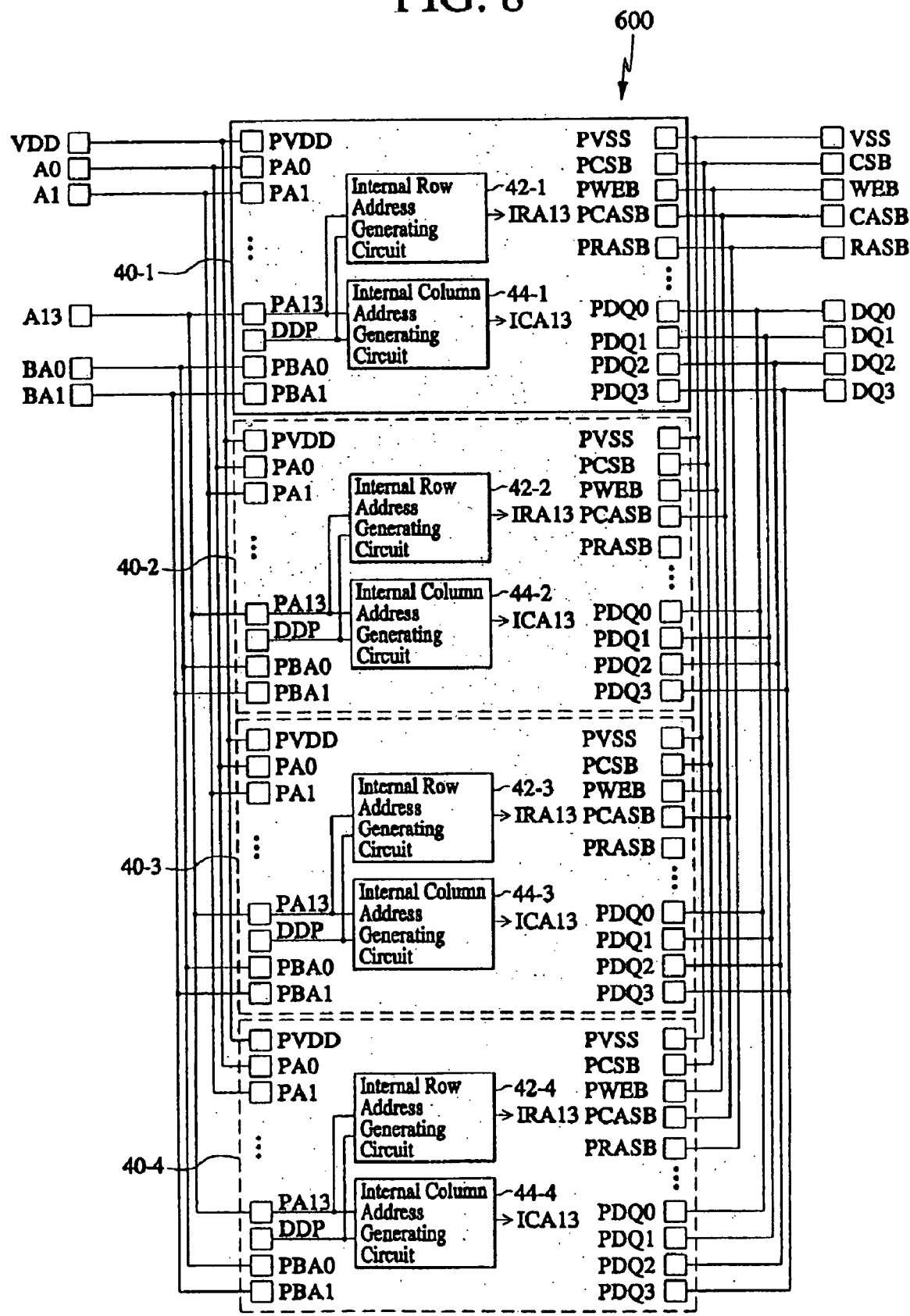
FIG. 8 illustrates connections between memory chip pads of four semiconductor memory devices and the external pins implemented in the semiconductor memory device package according to an exemplary embodiment of the present invention.

FIG. 8 illustrates a semiconductor memory device package 600 in which four semiconductor memory devices (memory chips) are implemented according to an exemplary embodiment. Specifically, FIG. 8 illustrates connections between memory chip pads of the four memory chips 40-1~40-4 and the plurality of external pins. Each of the four memory chips 40-n (n=1~4) are implemented to include a corresponding internal row address generating device 44-n and internal column address generating device 44-n.

According to an exemplary embodiment, the semiconductor memory device package 600 of FIG. 8 has a 1 Gbit memory capacity, each of the four memory chips 40-1~40-4 respectively having 256 Mbits of memory capacity.

As shown in FIG. 8, each memory chip 40-n (n=1~4) may include four memory cell array banks, each array including $2^{13}$ rows by $2^{11}$ columns of memory cells. Each memory cell in an array bank may correspond to a cell address represented by 13 row address bit signals (RA0~RA12) and 11 column address bit signals (CA0~CA9, and CA11). Each memory cell holds four data bits, which are input or output via four data input/output ports. Accordingly, the total memory capacity of each respective memory chip 40-n is $2^{13} \times 2^{11} \times 4 \times 4 = 256$ Mbits.

While each of the memory chips 40-1~40-4 require only thirteen address input terminals PA0~PA12 to receive a memory cell address, the address pad for each memory cell 44-n includes an additional address input terminal PA13. The signals applied to the address input terminal PA13 and control pad DDP of each of the memory chips 40-1~40-4 are used to determine whether the respective memory chip is selected (i.e., enabled) to perform the read/write operation.

All of the like reference labels and numbers indicated in both FIG. 6 and FIG. 8 designate like elements. Similar to the semiconductor package 400 shown in FIG. 6, all of the pads for each of the memory chips 40-1~40-4 are commonly connected to the corresponding external pins of the semiconductor package 600.

According to an exemplary embodiment, similar to the semiconductor package 400 of FIG. 6, the control terminal DDP of each respective memory chip 40-n is set to a particular voltage state, e.g., one of a first and second voltage state. Two of the memory chips 40-1~40-4 may be set to a level H state while the other two memory chips are set to the voltage level L. The respective control terminals DDP may be set to a voltage state as described above with respect to the semiconductor package 400 of FIG. 6 (e.g., by the presence or absence of an electrical connection to an applied power voltage source).

Next, the operation of the semiconductor memory device 600 of FIG. 8 to perform a read/write data operation according to an exemplary embodiment will be described.

An inverted chip selective signal is applied to the inverted chip selective signal pin CSB. Also, an inverted row address strobe command is applied to the inverted row address strobe pin RASB; 14 row address bit signals (RA0~RA12) and a row decoder signal are applied to the address pins A0~A12 and A13, respectively; and two bank address bit signals are applied to the bank address pins BA0 and BA1.

At this time, the row decoder bit signal applied to pin A13 is input to the respective internal row address generating devices 42-1~42-4. Each internal row address generating device 42-n generates an internal row address IRA13 based on the received row decoder bit signal and the voltage state of the control pad DDP. If the generated internal row address IRA13 is a specific value (i.e., a row enabling signal), the row address signal decoder (not shown) of the corresponding memory chips 40-n is enabled to decode the row address bit signals (RA0~RA12). Accordingly, the enabled row address signal decoder (not shown) outputs a signal for accessing the row of memory cells (not shown) referenced to by the row address bit signals (RA0~RA12).

Another set of signals are applied to the external pins of the semiconductor package 600, including an inverted web enabling signal applied to the inverted web enabling signal pin WEB. An inverted column address strobe command is applied to the inverted column address strobe pin CASB, the 11 column address bit signals (CA0~CA9 and CA11) and the 1 bit auto precharge command CA10 are applied to the address pins A1~A12, and a column decoder bit signal is applied to address pin A13.

At this time, the column decoder bit signal applied to address pin A13 is input to each respective internal column address generating device 44-n. Each internal column address generating device 44-n generates an internal column address ICA13 based on the voltage state of the corresponding control pad DDP. If the generated internal column address ICA13 is a specific value, a column address signal decoder (not shown) within the corresponding memory chip 40-n is enabled to decode the received column address bit signals and output a signal for accessing the corresponding column of memory cells.

Based on the configurations of the internal row address generating devices 42-1~42-4 and the internal column address generating devices, which will be described in more detail below, only one of memory chips 40-1~40-4 will generate both a row enabling signal and a column enabling signal.

Accordingly, only one of the memory chips 40-1~40-4 will be enabled to access to perform a read/write data (as controlled by the inverted write enable signal) operation on the memory cell or cells (not shown) corresponding to the received address bit signals.

As a result, four bits of data is either input or output through the data input/output pins DQ0~DQ3 according to the write/read data operation.

Accordingly, any of the four memory chips 40-1~40-4 can be enabled by a single inverted chip enable signal while utilizing the conventional semiconductor memory board layout for the semiconductor package 600, without the dissipating the high operation current required by operating all of the memory chips 40-1~40-4 simultaneously.

Figure 9:
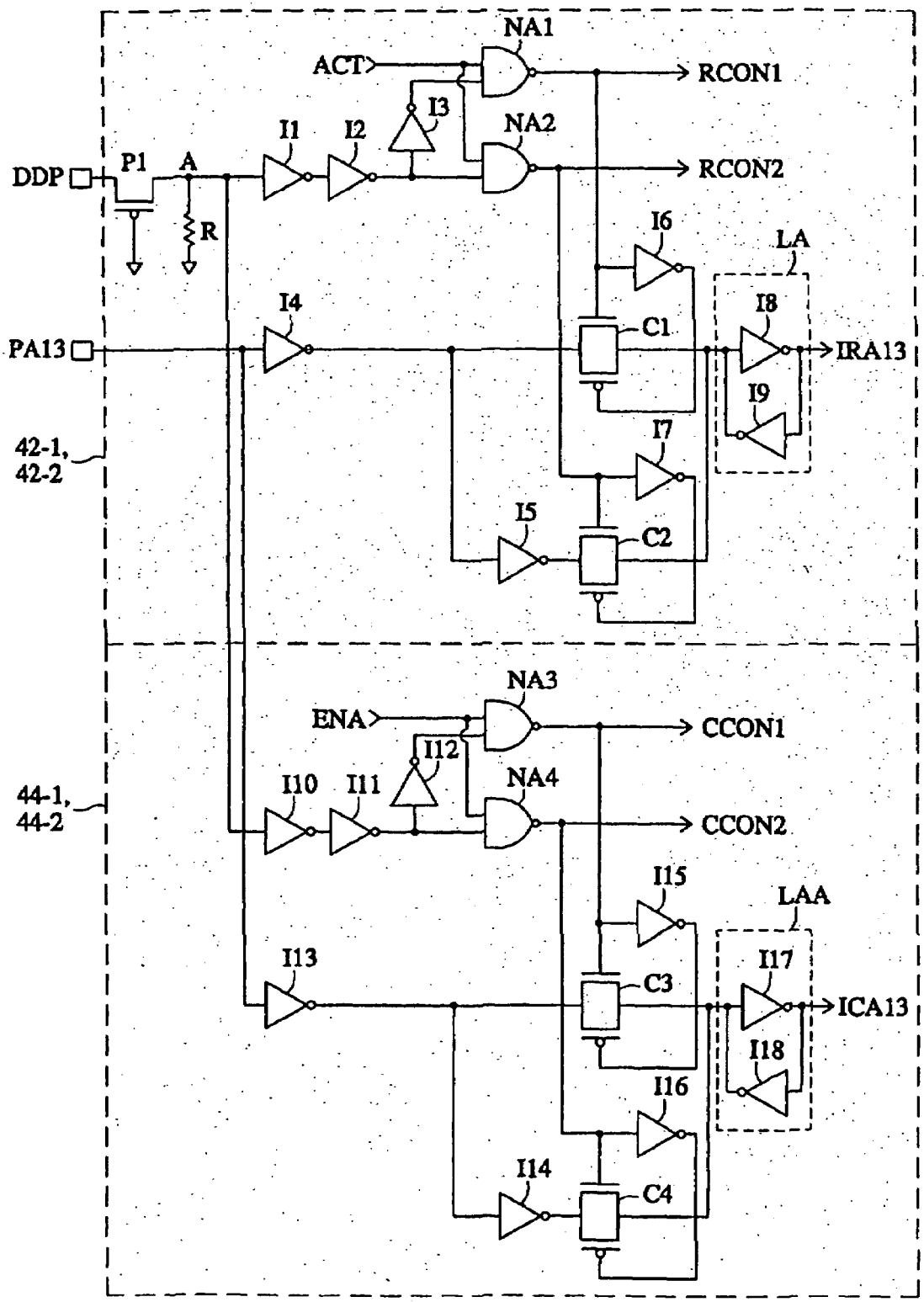
FIGS. 9 and 10 illustrate schematic views of the internal address generating devices utilized by the semiconductor memory devices implemented in the semiconductor memory device package of FIG. 8 according to an exemplary embodiment of the present invention.
Figure 10:
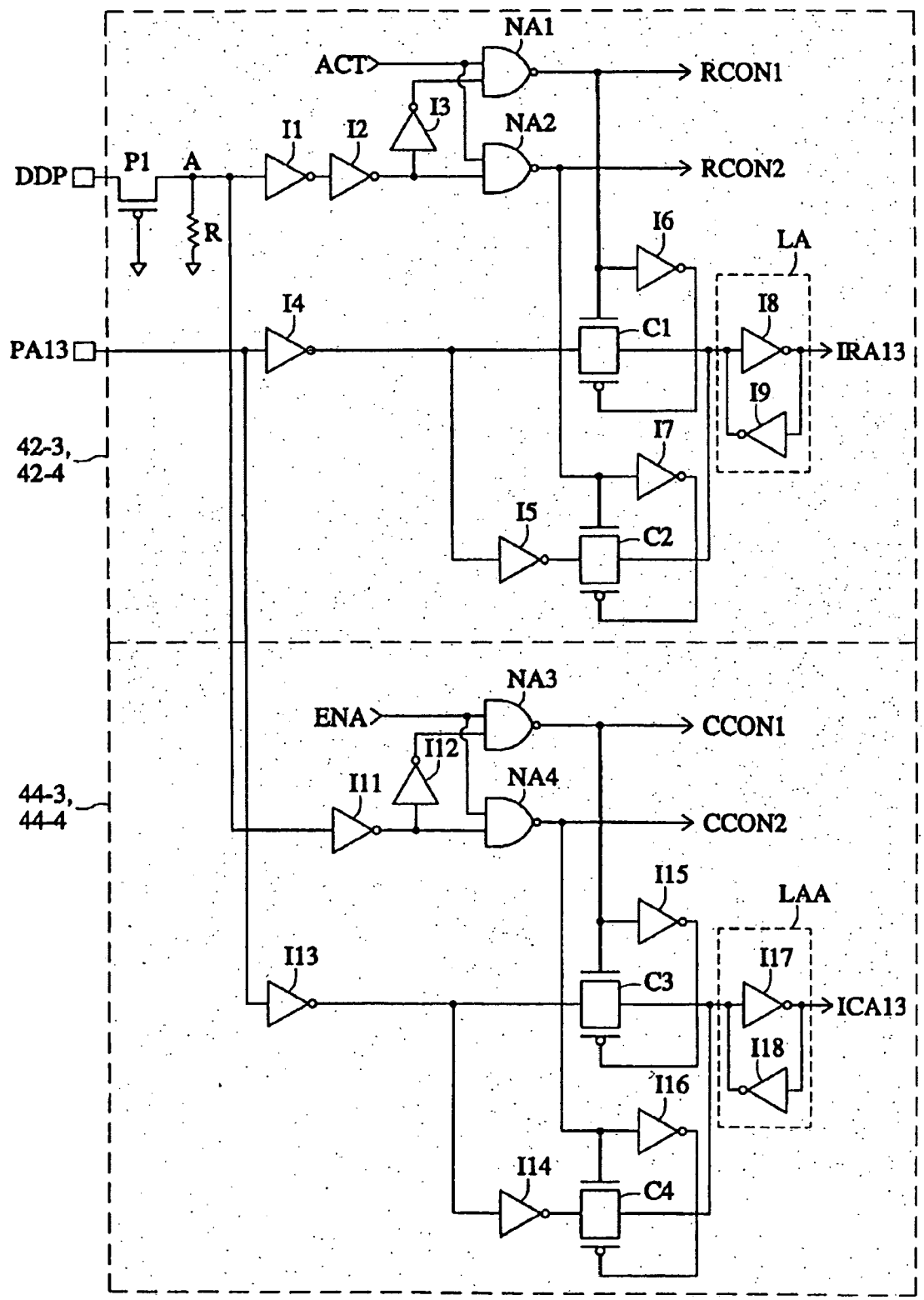

FIGS. 9 and 10 illustrate schematic views of the internal address generating devices utilized by the semiconductor memory devices implemented in the semiconductor memory device package of FIG. 8 according to an exemplary embodiment of the present invention. With respect to FIGS. 7, 9, and 10, like reference numbers refer to like elements.

In an exemplary embodiment, two of the memory chips 40-1~40-4 will include a control terminal DDP set at a first voltage level (e.g., level H) while the other two will include a control terminal DDP set at a low voltage level. To ensure that only one memory chip 40-n is selected in response to the applied row decoder bit signal, column decoder bit signal, the internal address generating devices (i.e., the internal row generating devices 42-n and the internal column generating devices 44-n) of each memory chip 40-n must be configured to generate a combination of internal row and column addresses IRA13 and ICA13, which is different from those of all other memory chips 40-n in the semiconductor package 600.

This can be achieved by implementing a different configuration for either the internal row address generating device 42-n or the internal column address generating device 44-n for each of the two memory chips 40-n whose control terminals DDP are set to the same voltage level. Particularly, FIGS. 9 and 10 illustrate an exemplary embodiment where the internal column address generating devices 44-n are configured differently for each set of memory chips 40-n whose control terminals DDP are set to the same voltage level.

It should be noted that FIGS. 9 and 10 only illustrate an exemplary embodiment, and that the present invention is not thus limited. Exemplary embodiments of the present invention cover all other embodiments that will be readily contemplated by those skilled in the art to assure that a unique combination of internal row address IRA13 and internal column address ICA13 will be generated for each memory chip 40-n.

According to the exemplary embodiments illustrated by FIGS. 9 and 10, the control terminals DDP of memory chips 40-1 and 40-3 are set to a level H while the control terminals DDP of memory chips 40-2 and 40-4 are set to a level L. FIG. 9 illustrates schematic views of the respective internal row address generating devices 42-1 and 42-2 and the respective internal column address generating devices 44-1 and 44-2 of the memory chips 40-1 and 40-2. FIG. 10 illustrates schematic views of the respective internal row address generating devices 42-3 and 424 and the respective internal column address generating devices 44-3 and 44-4 of the memory chips 40-3 and 40-4.

As shown in FIGS. 9 and 10, each respective internal row address generating device 42-n of the memory chips 40-1~40-4 has the same configuration as the internal row address generating device illustrated in FIG. 7. Thus the operation of each internal row address generating device 42-n illustrated in FIGS. 9 and 10 is the same as that described above with respect to FIG. 7, and will not be repeated here.

Referring to FIG. 9, the configuration of each of the internal column address generating devices 44-1 and 44-2 is nearly the same as the configuration of the internal row address generating devices 42-n, with the exception that the NAND logic gates NA3 and NA4 are connected to receive another type of command signal ENA (e.g., the inverted write enable signal), which is received at the external pins of the semiconductor package 600 along with the column address bit signals (CA0~CA9 CA11). This signal ENA will be referred to as an enablement command signal ENA to differentiate it from the activation command signal ACT.

Thus, the internal column address generating devices 44-1 and 44-2 are configured to respond to the received command signal ENA and the received column decoder bit signal (applied to address input terminal PA13) in the same manner as the internal row address generating devices 42-1 and 42-2 responds to the activation command signal ACT and the received row decoder signal.

The operation of the internal column generating device 44-1 is as follows. Since node A is logic H, when a level H enablement command signal ENA is applied to the semiconductor package 600, the first column control signal CCON1 of logic H is produced, while a second column control signal CCON2 of logic L is produced. Thus, the CMOS transfer gate C3 is turned on, and the CMOS transfer gate C4 is turned off. Thus, a transfer path consisting of inverter I13, transfer gate C3, and latch LM is provided to transfer the column bit decoder signal as the internal column address ICA13.

Therefore, if the column decoder bit signal applied to input terminal PA13 is level H, an internal column address ICA13 of level H (i.e., column enabling signal) is generated; alternatively, if the applied column decoder bit signal is level L, an internal column address ICA13 of level L is produced.

The operation of the internal column generating device 44-3 is as follows. Since node A is logic L, when a level H enablement command signal ENA is applied to the semiconductor package 600, a first column control signal CCON1 of level L is produced, while a second column control signal CCON2 of level H is produced. Thus, the CMOS transfer gate C3 is turned off, and the CMOS transfer gate C4 is turned on, and an inverting path consisting of inverters I13 and 114, gate C4, and latch LAA is provided to invert the value of the column decoder bit signal.

Accordingly, if the applied column decoder bit signal of level L is applied to address input terminal RA13, an internal column address ICA13 of 'L' level is produced; alternatively, when a level H column decoder bit signal is applied an internal column address ICA13 of 'H' level (i.e., a column enabling signal) is produced.

Referring to FIG. 10, the configuration of internal column address generating devices 44-3 and 44-4 differs from the configuration of internal column address generating devices 44-1 and 44-2 only in that inverter I10 is removed. Thus, internal column address generating devices 44-1 and 44-3 will produce complementary internal column addresses ICA13 even though the node A of each has the same voltage level H. Similarly, the internal column address generating devices 44-2 and 44-4 will also produce complementary internal column addresses ICA13 even though the node A for each has the same voltage level L.

According to the exemplary embodiment described above, if a level H row decoder bit signal is applied along with the activation command ACT, and a level H column decoder bit signal is applied along with the enablement command ENA, the memory chip 40-1 will produce the row and column enabling signals and thereby be selected to perform the read/write operation. If a level L row decoder bit signal and a level L column bit decoder signal are applied, the memory chip 40-2 will be selected. If a level H decoder bit signal and a level L column decoder bit signal are applied, memory chip 40-3 is selected. If a level L row decoder signal and a level H column bit decoder signal are applied, the memory chip 404 is selected. Accordingly, only one of the four memory chips 40-1~40-4 are selected according to the above described configuration.

According to exemplary embodiments of the present invention, the semiconductor memory device package may be fabricated to include two or more semiconductor memory devices implemented in a stacked configuration. However, the present invention is not limited to such a configuration and may include any other suitable configuration for implementing a plurality of semiconductor devices or packages into a single package.

Further, although exemplary embodiments of the present invention are described above with specific memory capacities, the present invention is in no way limited to these exemplary embodiments. It will be readily apparent to those skilled in the art that the present invention includes any obvious variations of fabricating high capacity semiconductor memory device packages using a plurality of lower capacity memory chips or packages.

Further, while exemplary embodiments of the present invention are described above with respect to asynchronous semiconductor memory devices, the present invention is not thus limited, and also applies to synchronous semiconductor memory device.

While the invention has been particularly shown and described with reference to the above exemplary embodiments, it will be understood by those skilled in the art that these exemplary embodiments do not limit the present invention, and that various changes in form and details may be made without departing from the spirit and scope of the invention as defined by the appended claims.

What is claimed is:

1. A semiconductor package comprising:
    one or more external address input pins for receiving an address signal;
    two or more semiconductor memory devices, each semiconductor memory device including one or more address input terminals, wherein corresponding address input terminals of the semiconductor memory devices are commonly connected to corresponding external address input pins; and
    an internal address generator for selecting one of the semiconductor memory devices to perform at least one of a read and write data operation, the internal address generating device selecting the semiconductor device based on the received address signal.

2. The semiconductor package according to claim 1, wherein the semiconductor memory devices are arranged in a stacked configuration in the semiconductor package.

3. The semiconductor package according to claim 1 further comprising one or more external command input pins and one or more external data input/output pins, wherein each semiconductor memory device further includes,
    one or more input/output data terminals, wherein corresponding data input/output terminals of the semiconductor memory devices are commonly connected to corresponding external data input/output pins; and
    one or more command input terminals, wherein corresponding data command input terminals of the semiconductor memory devices are commonly connected to corresponding external command input pins.

4. The semiconductor package according to claim 1, the received address signal including one or more cell address bit signals and one or more device selection bit signals, wherein
    the internal address generator includes an internal address generating device for each of the semiconductor memory devices, wherein an address signal decoder of the selected semiconductor memory device is enabled to receive and decode the cell address bit signals by the corresponding internal address generating device based on the device selection bit signals, the selected semiconductor memory device performing the at least one of a read and write data operation on a memory cell corresponding to the cell address bit signals.

5. The semiconductor package according to claim 4, wherein each semiconductor memory device further includes a control terminal, the control terminal being set to one of a first and second voltage state, the internal address generating device of the selected semiconductor memory device enabling the corresponding address signal decoder to receive and decode the cell address bit signals based on the device selection bit signals and the voltage state of the corresponding control terminal.

6. The semiconductor package according to claim 5, the semiconductor memory devices including a first and second semiconductor memory device, the control terminal of the first semiconductor memory device being set to the first state and the control terminal of the second semiconductor memory device being set to the second state, wherein
    the cell address bit signals includes one or more row address bit signals,
    the device selection bit signals includes a row decoder bit signal, and
    a row address signal decoder in the selected semiconductor memory device is enabled to receive and decode the row address bit signals by the corresponding internal address generating device based on the row decoder bit signal and the voltage state of the corresponding control terminal.

7. The semiconductor package according to claim 6, further comprising a command input pin for receiving an activation command signal, wherein
    the internal address generating device of each semiconductor memory devices further includes a row control signal generating device, the row control signal generating device responding to the received activation command signal by generating a first row control signal if the corresponding control terminal is set to the first voltage state and generating a second row control signal if the corresponding control terminal is set to the second voltage state, and
    the internal generating device generates a row enabling signal based on the row decoder bit signal and which of the first and second row control signals is generated, the generated row enabling signal determining whether or not the corresponding row address signal decoder is enabled to receive and decode the row address bit signals.

8. The semiconductor package according to claim 7, wherein the internal generating device further includes,
    a transferring device for generating the row enabling signal by transferring the row decoder bit signal if the first row control signal is generated,
    an inverting device for generating the row enabling signal by inverting the row decoder bit signal if the second row control signal is generated.

9. The semiconductor package according to claim 6, further comprising a power voltage pin to which a power voltage is applied, each of the semiconductor memory devices further including a power voltage terminal, the power voltage terminals of the semiconductor memory devices being commonly connected to the power voltage pin, wherein
    the control terminal of each semiconductor device being selectively set to the first and second voltage state via a presence and absence, respectively, of an electrical connection between the control terminal and the power voltage terminal.

10. The semiconductor package according to claim 9, wherein a fuse link provides an electrical connection between the control terminal and the power voltage terminal of each semiconductor memory device, the fuse link of the second semiconductor memory device being blown to remove the electrical connection and selectively set the corresponding control terminal to the second voltage state.

11. The semiconductor package according to claim 6, the semiconductor memory devices further including a third and fourth semiconductor memory device, the control terminal of the third semiconductor memory device being set to the first state, the control terminal of the fourth semiconductor being set to the fourth state, wherein
the cell address bit signals further include one or more column address bit signals,
the device selection bit signals further include a column decoder bit signal, and
a column address signal decoder in the selected semiconductor memory device is enabled to receive and decode the column address bit signals by the corresponding internal address generating device based on the column decoder bit signal and the voltage state of the corresponding control signal.

12. The semiconductor package according to claim 11, further comprising at least one command input pin for receiving a first and second command signal, wherein:
the internal address generating device of each semiconductor memory devices further includes,
a row control signal generating device, the row control signal generating device responding to the first received command signal by generating a first row control signal if the corresponding control terminal is set to the first voltage state and generating a second row control signal if the corresponding control terminal is set to the second voltage state; and
a column control signal generating device, the column control signal generating device responding to the second received command signal by generating a first column control signal if the corresponding control terminal is set to the first voltage state and generating a second column control signal if the corresponding control terminal is set to the second voltage state,
the internal generating device generates a row enabling signal based on the row decoder bit signal and which of the first and second column control signals is generated, the generated row enabling signal determining whether the corresponding row address signal decoder is enabled to receive and decode the row address bit signals, and
the internal generating device generates a column enabling signal based on the column decoder bit signal and which of the first and second column control signals is generated, the generated column enabling signal determining whether or not the corresponding column address signal decoder is enabled to receive and decode the column address bit signals.

13. The semiconductor package according to claim 12, wherein the internal address generating device further includes,
a first transferring device for generating the row enabling signal by transferring the row decoder bit signal if the first row control signal is generated,
a first inverting device for generating the row enabling signal by inverting the row decoder bit signal if the second row control signal is generated,
a second transferring device for generating the column enabling signal by transferring the column decoder bit signal if the first column control signal is generated, and
a second inverting device for generating the column enabling signal by inverting the column decoder bit signal if the second column control signal is generated.

14. The semiconductor package according to claim 11, further comprising a power voltage pin to which a power voltage is applied, each of the semiconductor memory devices further including a power voltage terminal, the power voltage terminals of the semiconductor memory devices being commonly connected to the power voltage pin, wherein
the control terminal of each semiconductor device being selectively set to the first and second voltage state via a presence and absence, respectively, of an electrical connection between the control terminal and the power voltage terminal.

15. The semiconductor package according to claim 14, wherein a fuse link provides an electrical connection between the control terminal and the power voltage terminal of each semiconductor memory device, the fuse links of the second and fourth semiconductor memory devices being blown to remove the corresponding electrical connections and selectively set the corresponding control terminals to the second voltage state.

* * * * *